United States Patent
Yamada et al.

(10) Patent No.: US 9,543,923 B2
(45) Date of Patent: Jan. 10, 2017

(54) CRYSTAL RESONATOR INCLUDING BLANK AND SUPPORTING PORTION

(71) Applicant: NIHON DEMPA KOGYO CO., LTD., Tokyo (JP)

(72) Inventors: Hiroaki Yamada, Saitama (JP); Takashi Yamaguchi, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 128 days.

(21) Appl. No.: 14/580,235

(22) Filed: Dec. 23, 2014

(65) Prior Publication Data
US 2015/0180446 A1    Jun. 25, 2015

(30) Foreign Application Priority Data
Dec. 24, 2013    (JP) .................................. 2013-265268

(51) Int. Cl.
*H03H 9/19*    (2006.01)
*H03H 9/02*    (2006.01)

(52) U.S. Cl.
CPC ........... *H03H 9/19* (2013.01); *H03H 9/02023* (2013.01)

(58) Field of Classification Search
CPC ................................ H03H 9/19; H01L 41/053
USPC ........................................................ 310/360
See application file for complete search history.

(56) References Cited

U.S. PATENT DOCUMENTS

| 2,119,848 | A | * | 6/1938 | Hawk | H03H 9/19 |
| | | | | | 29/25.35 |
| 4,350,918 | A | * | 9/1982 | Sato | G04F 5/063 |
| | | | | | 310/320 |
| 4,454,443 | A | * | 6/1984 | Lukaszek | H03H 9/02023 |
| | | | | | 310/348 |
| 6,031,319 | A | * | 2/2000 | Koyama | H03H 9/0528 |
| | | | | | 310/348 |
| 2012/0032563 | A1 | * | 2/2012 | Shimao | H03H 9/02023 |
| | | | | | 310/344 |
| 2012/0056514 | A1 | * | 3/2012 | Ishikawa | H03H 9/02157 |
| | | | | | 310/344 |
| 2013/0020911 | A1 | * | 1/2013 | Takahashi | H03H 3/02 |
| | | | | | 310/344 |

(Continued)

FOREIGN PATENT DOCUMENTS

| JP | 58-159014 | 9/1983 |
| JP | 03-150911 | 6/1991 |

(Continued)

*Primary Examiner* — J. San Martin
(74) *Attorney, Agent, or Firm* — Jianq Chyun IP Office (57) ABSTRACT

A crystal resonator includes a blank and a supporting portion. The blank is cut out from a crystal parallel to a surface that includes a X"-axis and a Z"-axis respectively obtained by rotating an X'-axis and a Z'-axis by 45° around a Y'-axis in a direction from the Z'-axis toward the X'-axis. The X'-axis, the Y'-axis, and the Z'-axis are respectively obtained by rotating a crystallographic X-axis, Y-axis, and Z-axis of the crystal by equal to or more than +37° and equal to or less than 51.5° around the X-axis. The supporting portion is connected to an outer periphery of the blank at a position near an apex of the reference rectangle and where a displacement of vibration in the X"-axial direction or the Z"-axial direction becomes a local minimum when two longitudinal modes of vibration are coupled.

7 Claims, 7 Drawing Sheets (56) References Cited

U.S. PATENT DOCUMENTS

| | | | | |
|---|---|---|---|---|
| 2014/0265735 A1* | 9/2014 | Asano | ............ | H03H 9/1021 |
| | | | | 310/365 |
| 2014/0340163 A1* | 11/2014 | Kubota | ............ | H01L 41/053 |
| | | | | 331/158 |
| 2014/0368089 A1* | 12/2014 | Omomo | ............ | H03H 3/02 |
| | | | | 310/348 |
| 2015/0158184 A1* | 6/2015 | Kamijo | ............ | H02N 2/004 |
| | | | | 74/490.05 |
| 2016/0036413 A1* | 2/2016 | Yamashita | ............ | H03H 9/19 |
| | | | | 331/158 |

FOREIGN PATENT DOCUMENTS

| | | | |
|---|---|---|---|
| JP | 08-213872 | | 8/1996 |
| JP | 2001-313537 | | 11/2001 |
| JP | 2004-135357 | | 4/2004 |
| JP | 2012-175520 | | 9/2012 |
| JP | 2012175520 A | * | 9/2012 |
| JP | 2013102346 A | * | 5/2013 |

* cited by examiner

CRYSTAL RESONATOR INCLUDING BLANK AND SUPPORTING PORTION

CROSS-REFERENCE TO RELATED APPLICATIONS

This application claims the priority benefit of Japan application serial no. 2013-265268, filed on Dec. 24, 2013. The entirety of the above-mentioned patent application is hereby incorporated by reference herein and made a part of this specification.

TECHNICAL FIELD

This disclosure relates to a crystal resonator.

DESCRIPTION OF THE RELATED ART

Crystal resonators used as a reference source of frequency and time are classified into several kinds of "cut" according to crystallographic orientation when a vibration plate that constitutes the crystal resonator, namely, a blank is cut out from a single crystal of a crystal. Conventionally, for example, cuts such as AT-cut and SC cut are widely known as such cut. Above all, the blank of GT cut has a superior frequency/temperature characteristics and a very small variation of resonance frequency when ambient temperature changes. Accordingly, an application of the blank of GT cut to a crystal controlled oscillator with high accuracy and high stability and similar application is expected. The crystal resonator with rectangle-shaped GT cut can be downsized in a low frequency band (for example, 2 to 10 MHz) and has the frequency/temperature characteristics where a primary temperature coefficient becomes 0 at room temperature (near 25° C.).

In the crystal, as is well known, three crystallographic axes of X-axis, Y-axis, and Z-axis are crystallographically determined. The blank that is cut out along a surface perpendicular to the Y-axis (namely, the surface parallel to the X-axis and the Z-axis) is referred to as Y-cut plate. The GT cut is the cut of the blank formed by rotating the Y-cut plate around the X-axis by +51.5° (namely, θ=+51.5°) and further rotating the plate by +45° (namely, β=+45°) inside the surface of the plate (for example, see Japanese Unexamined Patent Application Publication No. 8-213872). The θ and β are parameters generally used for identifying a cutting orientation in the crystal. In order to specify an orientation of GT cut inside the blank, assume that the axes obtained by rotating the X-axis, Y-axis, and Z-axis around the X-axis by the above-described +51.5° are X'-axis, Y'-axis, and Z'-axis, respectively. Since it is the rotation around the X-axis, the X'-axis corresponds to the X-axis. Further, assume that axes obtained by rotating the X'-axis and Z'-axis by 45° around the Y'-axis and in the direction from the Z'-axis toward the X'-axis are X"-axis and Z"-axis, respectively.

Figure 1:
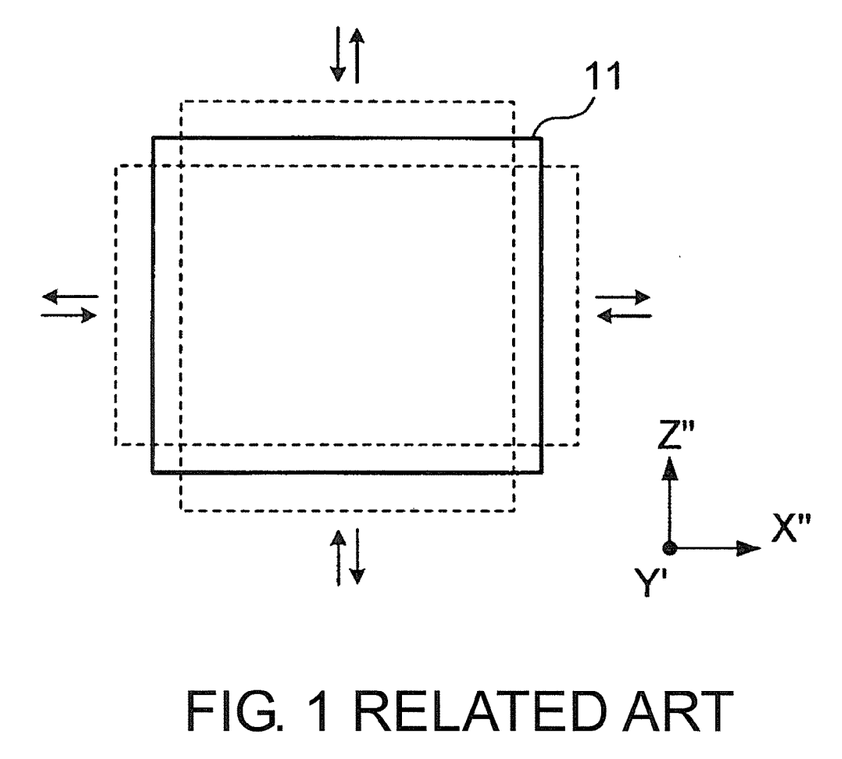
FIG. 1 is a plan view illustrating a mode of vibration of a blank of GT cut according to a related art.

Here, a mode of vibration in the blank of GT cut will be described. As illustrated in FIG. 1, the mode of vibration in a blank 11 of GT cut is the mode of vibration (also referred to as a width and length-longitudinally coupling mode of vibration) where a longitudinal mode of vibration (stretching vibration) in the X"-axial direction and a longitudinal mode of vibration in the Z"-axial direction are coupled. In the drawing, directions of the stretching vibrations are illustrated by arrows, and outlines displaced by vibrations are illustrated by dashed lines. However, for explanation, the displaced outlines are described as much larger displacements than actual amounts of displacement in the blank 11.

Because of the mode of vibration where two longitudinal mode of vibrations are coupled, conventionally, the blank of GT cut is formed in a rectangular or square shape where one pair of sides is parallel to X"-axis and the other pair of sides is parallel to Z"-axis, and is used as a vibration plate in the crystal resonator, namely a crystal element. Excitation electrodes to excite the blank as the vibration plate are disposed in both principal surfaces of the blank respectively. Since the longitudinal mode of vibration is used as a main vibration, the blank of GT cut can be formed in a small size even if a resonance frequency is in the low frequency band. Additionally, when a crystal unit of GT cut is formed to be a square vibration plate with each side having the same length, a crystal unit of GT cut vibrates in the mode of vibration referred to as a Lame vibration mode different from the width and length-longitudinally coupling mode of vibration. Therefore, in principle, a planar shape of the crystal unit of GT cut is not formed in a square shape.

The mode of vibration of the blank is different with respect to each cut. For example, in the case of the conventionally widely used blank of AT-cut, the mode of vibration is a thickness shear mode of vibration and the resonance frequency is determined only by its thickness. Accordingly, in the blank of AT-cut, a planar shape can be arbitrarily set. This ensures that the crystal element is constituted so as to be supported at a steady point of the thickness shear mode of vibration. However, in the crystal element of GT cut, the mode of vibration is the width and length-longitudinally coupling mode of vibration. Thus, the resonance frequency varies in response to the planar shape or size, such as width or length, and both of the vibrations of two modes of vibration that couple each other must surely occur. Therefore, it is not possible that the planar shape is arbitrary set and/or a supporting portion is arranged at an arbitrary position. In particular, in an outer peripheral portion of the rectangle-shaped blank of GT cut, generally, the steady point in a displacement of vibration does not exist.

Figure 2:
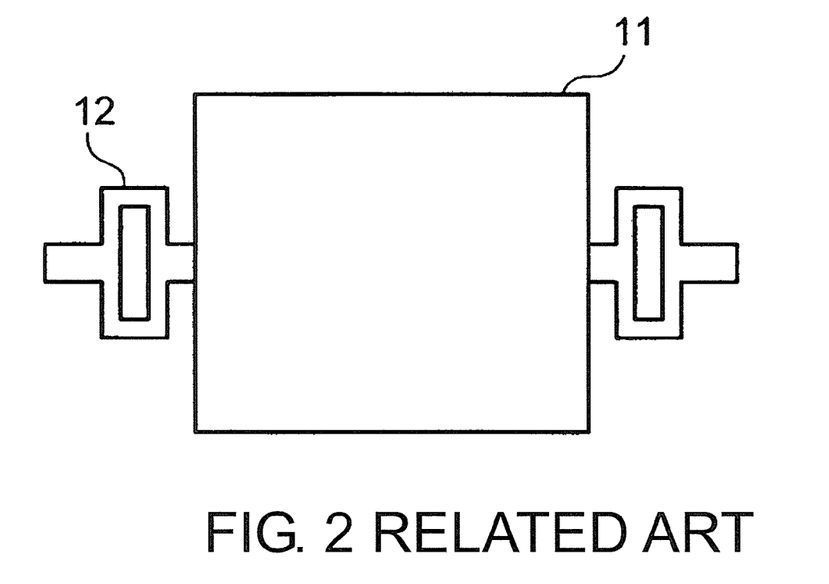
FIG. 2 is a plan view illustrating a conventional rectangle-shaped GT cut crystal resonator where supporting portions are disposed.

When the blank of GT cut is used as the vibration plate that constitutes the crystal resonator, namely the crystal element, the blank is required to be held inside a vessel so as not to be in contact with a wall surface or a similar surface of the vessel of the crystal resonator. However, in the outer peripheral portion of the blank of the rectangle-shaped GT cut, the steady point in the displacement of vibration does not exist. Thus, the supporting portion to the crystal element is required to be disposed in the position and shape so as not to interfere with the vibration as much as possible. Accordingly, as shown in Japanese Unexamined Patent Application Publication No. 58-159014, it is proposed that use of a photolithography technology integrally forms a main body portion (a vibrator) of the vibration plate and the supporting portion for the main body portion from a plate-shaped material of the crystal. In that case, as illustrated in FIG. 2, supporting portions 12 are connected to the positions of each middle point of one pair of sides facing each other in the rectangle-shaped main body portion in the blank 11 as the vibration plate. At this time, crank-shaped bent portions are disposed or similar measures are taken in order that the supporting portions 12 may not affect the vibration of the blank 11. Furthermore, by the use of a method such as a finite element method, the shape of the supporting portions 12 is designed in order that the resonance frequencies of the vibrator alone and a whole resonance system including the supporting portions 12 approximately may become the same.

However, the structure of the crystal resonator of GT cut including the supporting portions illustrated in FIG. 2 is complicated and difficult to fabricate. Further, the size of the supporting portions themselves cannot be ignored compared with the main body portion of the vibration plate. Therefore, there are concerns that variations of dimensions in the supporting portions significantly affect a vibration characteristic of the blank and hinder downsizing of the crystal resonator.

Therefore, as the crystal resonator of GT cut, the inventors proposed to use an elliptically-shaped blank as the vibration plate (Japanese Unexamined Patent Application Publication No. 2012-175520). In the blank formed in an elliptical shape where the vibration directions of the two perpendicular longitudinal modes of vibration in GT cut are set a long axis and a short axis, respectively, there exist four points of the positions where the displacements of vibration become local minimums in the outer periphery of the blank when the two longitudinal mode of vibration are coupled. Thus, by the constitution that supports the blank at such points, even if the simply constituted supporting portions are employed, the blank can be supported without affecting the vibration characteristic as the crystal resonator.

PRIOR ART DOCUMENT

Patent Document

[Patent Reference 1] Japanese Unexamined Patent Application Publication No. 8-213872
[Patent Reference 2] Japanese Unexamined Patent Application Publication No. 58-159014
[Patent Reference 3] Japanese Unexamined Patent Application Publication No. 2012-175520

SUMMARY

In the crystal resonator of GT cut, the frequency, the vibration characteristic, and the frequency/temperature characteristics is determined by the shape. When the elliptically-shaped blank of GT cut is used as disclosed in Japanese Unexamined Patent Application Publication No. 2012-175520, the frequency/temperature characteristics are determined by the shape as an ellipse (especially, the ratio of the length of the long axis and the short axis). Thus, there is a concern that freedom of design is limited when an attempt is made to obtain the crystal resonator with the desired various characteristics.

A need thus exists for a crystal resonator which is not susceptible to the drawback mentioned above.

A crystal resonator according to an aspect of the disclosure includes a blank and a supporting portion. The blank is cut out from a crystal parallel to a surface that includes an X"-axis and a Z"-axis. The X"-axis and the Z"-axis are respectively obtained by rotating an X'-axis and a Z'-axis by 45° around a Y'-axis in a direction from the Z'-axis toward the X'-axis. The X'-axis, the Y'-axis, and the Z'-axis are respectively obtained by rotating a crystallographic X-axis, Y-axis, and Z-axis of the crystal by equal to or more than +37° and equal to or less than 51.5° around the X-axis. The supporting portion supports the blank. The blank has a rectangle having sides respectively parallel to the X"-axis and the Z"-axis as a reference rectangle. The blank has a shape where at least one pair of opposite sides bulging outward of the reference rectangle. The blank has two longitudinal modes of vibration respectively perpendicular with the X"-axial direction and the Z"-axial direction. The supporting portion is connected to an outer periphery of the blank at a position near an apex of the reference rectangle. The position is where a displacement of vibration in the X"-axial direction or the Z"-axial direction becomes a local minimum when the two longitudinal modes of vibration are coupled.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Next, a preferred embodiment of the disclosure will be described with reference to the drawings.

FIGS. 3A to 3D each illustrates an exemplary planar shape of a blank 31 used as a vibration plate in a crystal resonator based on the disclosure. These blanks 31 are each a blank where a Y-cut plate (a surface perpendicular to a crystallographic Y-axis of a crystal) is rotated by an angle θ around an X-axis of the crystal, and is further rotated by 45° inside the surface of the Y-cut plate. Here, the rotation angle θ falls in a range of +37°≤θ≤+51.5°. Here, assume that coordinates obtained by rotating the X-axis, the Y-axis, and a Z-axis of the crystal by θ around the X-axis are an X'-axis, a Y'-axis, and a Z'-axis (thus, the X'-axis corresponds to the X-axis). Further, assume that axes obtained by rotating the X'-axis and Z'-axis by 45° around the Y'-axis in the direction from the Z'-axis toward the X'-axis are an X"-axis and a Z"-axis, respectively. Then, the blank 31 has a surface parallel to the X"-axis and the Z"-axis. The blank 31 has two perpendicular longitudinal modes of vibration where vibration directions are the X"-axial direction and the Z"-axial direction, respectively. Further, due to a coupling of these two longitudinal modes of vibration, the blank 31 has a width and length-longitudinally coupling mode of vibration that alternately expands and contracts in the X"-axial direction and the Z"-axial direction.

Here, imaginarily assume that a rectangle having sides respectively parallel to the X"-axis and the Z"-axis is a reference rectangle 30. Then, the blank 31 based on this embodiment has a shape where each of four sides of the reference rectangle 30 bulges outward the reference rectangle 30. Accordingly, each apex of the reference rectangle 30 is positioned on an outer periphery of the blank 31, and the reference rectangle 30 is inscribed with respect to the outer periphery of the blank 31. Here, assume that a length in the X"-axial direction of the reference rectangle 30 is Lx, and a length in the Z"-axial direction of the reference rectangle 30 is Lz. In addition, assume that the maximum length in the X"-axial direction of the blank 31 is a, and the maximum length in the Z"-axial direction of the blank 31 is b. In this embodiment, it may be Lx=Lz, however, in order to suppress the vibration by an unintended mode of vibration such as a Lame vibration mode, it is necessary to be a≠b. However, in order to generate the width and length-longitudinally coupling mode of vibration by the coupling of the two longitudinal modes of vibration in the X"-axial direction and the Z"-axial direction, a and b are necessary to be comparatively close values. In the following, for explanation, it is assumed as follows: Lx>Lz, a>b. However, since an elastic coefficient $C'_{11}$ in the X"-axial direction is equal to an elastic coefficient $C'_{33}$ in the Z"-axial direction, switching of dimensions in the X"-axial direction and dimensions in the Z"-axial direction ensures the completely same vibration characteristic. A ratio of the length in the X"-axial direction and the length in the Z"-axial direction in the blank 31 is referred to as a side ratio. When a>b, the side ratio is preferred to be 0.84≤b/a≤0.96. Since switching of the dimensions in the X"-axial direction and the dimensions in the Z"-axial direction ensures the completely same vibration characteristic, when b>a, the side ratio is preferred to be 0.84≤a/b≤0.96.

Figure 3A:
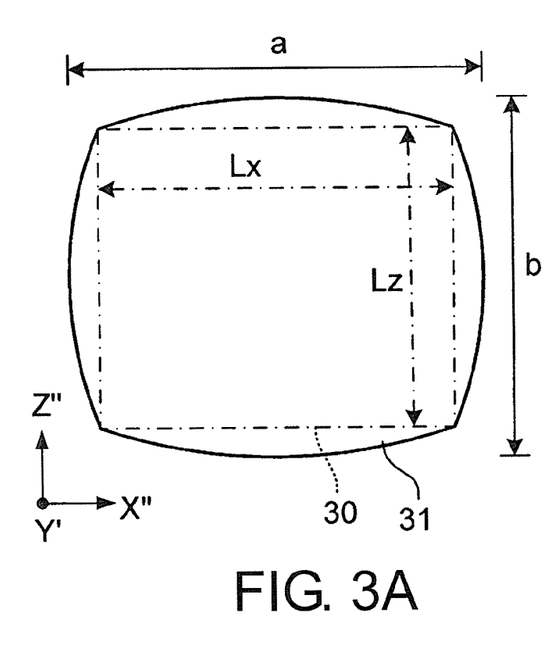
FIGS. 3A to 3D are top views illustrating exemplary planar shapes of the blank in the crystal resonator according to one embodiment of the disclosure.

The blank 31 illustrated in FIG. 3A has the shape where each side of the reference rectangle 30 bulges toward its outward as each adjacent apex of the reference rectangle 30 is connected by an elliptical arc, respectively. At this time, the two elliptical arcs connecting each other at the position of the apex of the reference rectangle 30 are set to be the elliptical arcs cut out from different ellipses. Namely, the blank 31 does not have the shape indicated by the single ellipse as a whole. In each ellipse of an origin of each elliptical arc, the length of the short axis relative to the length of the long axis is, for example, equal to or more than 0.3 and equal to or less than 0.6.

Figure 3B:
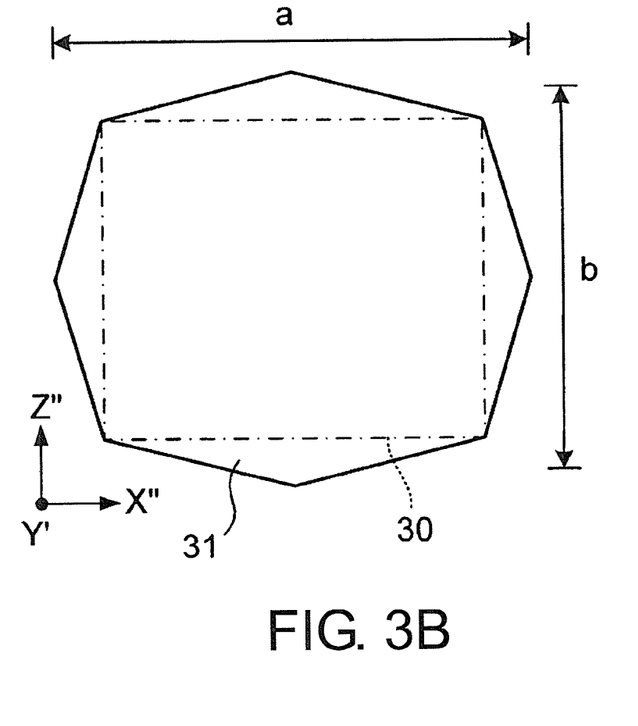

The blank 31 illustrated in FIG. 3B has the shape of the reference rectangle 30 bulging outward by four triangular shapes where each side of the reference rectangle 30 is the bottom side. Accordingly, the blank 31 is constituted with a convex octagon. Although not illustrated here, the blank 31 may be the shape of a convex hexagon by only one pair of opposite sides of the reference rectangle 30 bulging outward by the triangular shapes.

Figure 3C:
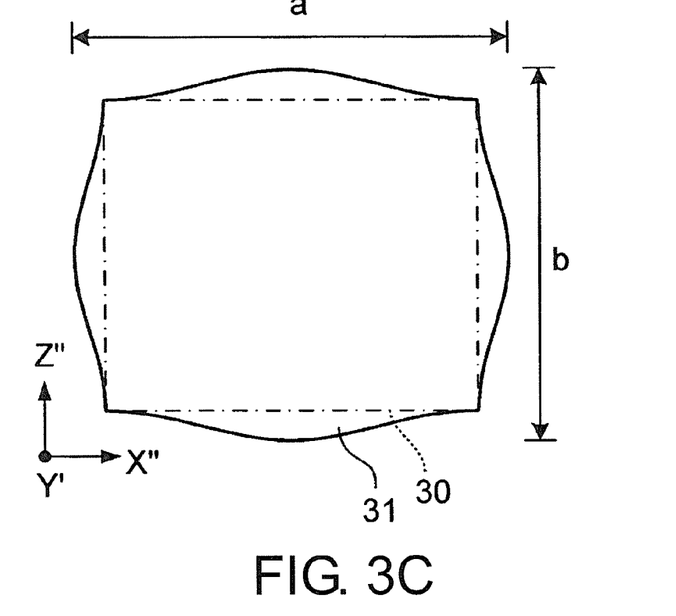

The blank 31 illustrated in FIG. 3C has the shape where each sides of the reference rectangle 30 bulges outward in a cosine curve. When each sides of the reference rectangle 30 bulges outward in a curve, the curve to be used is not limited to the cosine curve and any curve can be used.

Figure 3D:
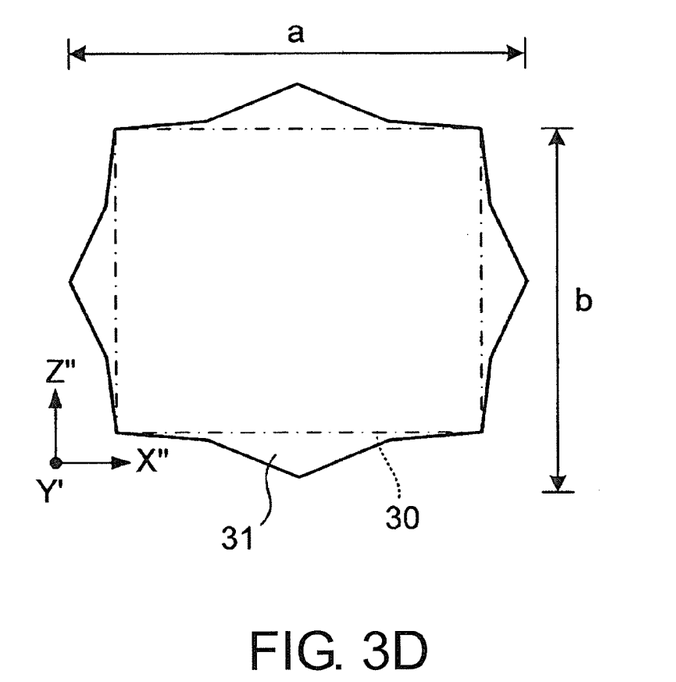

The blank 31 illustrated in FIG. 3D is formed in a hexadecagon as a whole by replacing each side of the reference rectangle 30 to a polygonal line with four line segments. At this time, it is not necessarily required to be the convex hexadecagon, and it may be a concave hexadecagon as illustrated. When the blank 31 is formed in a polygonal shape by each side of the reference rectangle 30 bulging outward, it is not limited to the octagon illustrated in FIG. 3B or the hexadecagon illustrated in FIG. 3D. It can be a polygonal shape with any number of corners that is equal to or more than the number of corners of a hexagon. Even in the blanks 31 illustrated in FIG. 3A, FIG. 3C, and FIG. 3D, similarly to the case of FIG. 3B, the shape may be formed by only one pair of opposite sides of the reference rectangle 30 bulging outward.

Next, a connected position of a supporting portion supporting the blank 31 in the crystal resonator of this embodiment will be examined.

Figure 4:
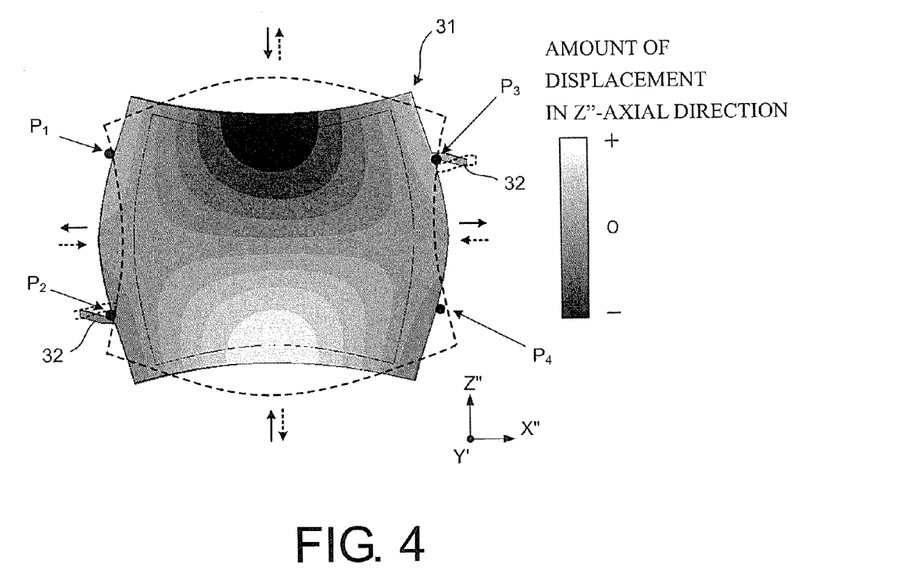
FIG. 4 illustrates a distribution of an amount of displacement in a Z"-axial direction in a displacement of vibration of a crystal unit.
Figure 5:
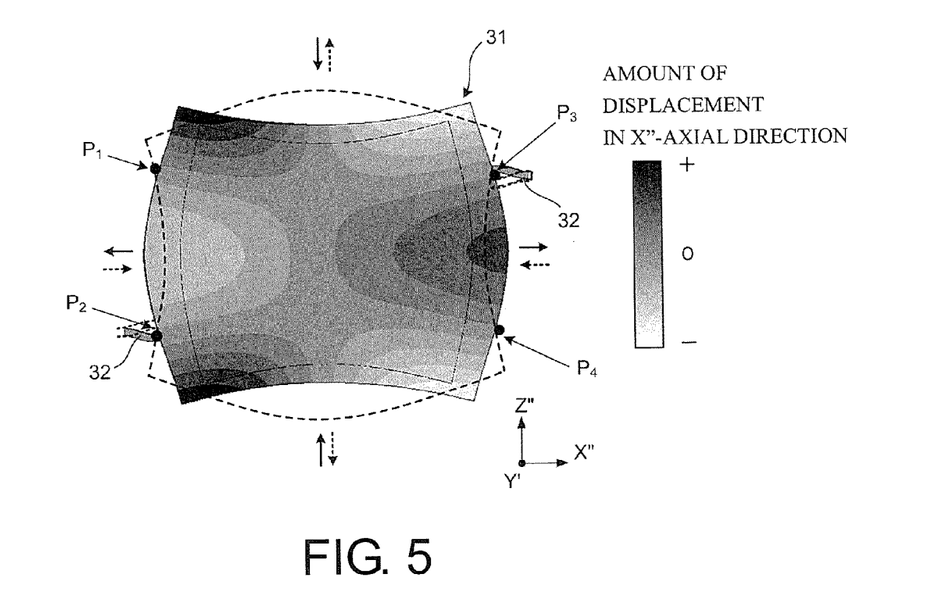
FIG. 5 illustrates a distribution of an amount of displacement in an X"-axial direction in a displacement of vibration of a crystal unit.

FIG. 4 and FIG. 5 respectively illustrate results, which are obtained by simulation, of distributions of amounts of displacement in the Z"-axial direction and the X"-axial direction inside a plate surface of the blank 31 when the blank 31 illustrated in FIG. 3A vibrates in the width and length-longitudinally coupling mode of vibration. In these drawings, a positive amount of displacement indicates the displacement in the positive direction of each axis, and a negative amount of displacement indicates the displacement in the negative direction. With regard to displacement of vibration in the Z"-axial direction, the displacement is small along the center line extending in the Z"-axial direction of the blank 31. However, an absolute value of the amount of displacement of the displacement of vibration in the X"-axial direction becomes a local maximum at the position where the center line intersects with the outer peripheral of the blank 31. On the other hand, with regard to the displacement of vibration in the X"-axial direction, the displacement is small along the center line extending in the X"-axial direction of the blank 31. However, an absolute value of the amount of displacement of the displacement of vibration in the Z"-axial direction becomes a local maximum at the position where the center line intersects with the outer peripheral of the blank 31. Accordingly, at the position of the center line extending in the X"-axial direction of the blank 31 or at the position of the center line extending in the Z"-axial direction, in other words, at the position corresponding to a middle point of each side of the reference rectangle 30, connection of the supporting portion with respect to the outer periphery of the blank 31 is not preferred. And now, with the reference to FIG. 5, there is a point where the displacement in the X"-axial direction becomes approximately 0 on the outer periphery of the blank 31 near the apex of the reference rectangle 30. In the drawings, these points are shown by $P_1$ to $P_4$. With the reference to FIG. 4, at the point $P_1$ to $P_4$, the amounts of displacement in the Z"-axial direction are also comparatively small. Therefore, by the connection of thin rod-shaped supporting portions 32 to some points among these points $P_1$ to $P_4$, the blank 31 can be supported.

Generally when the blank is held by a rod-shaped supporting member connected to the outer periphery of the blank, the blank is preferred to be held at the position where the displacement of vibration is 0. However, the position where the displacement of vibration is 0 does not exist by the mode of vibration in some cases. A rod-shaped member shows "flexible" behavior to bending stress than to compression/elongational stress. Thus, when the position where the displacement of vibration is 0 does not exist, the supporting member is preferred to be connected to the position where the stress applied to the supporting member is not the compression/elongational stress but the bending stress. In the examples illustrated in FIG. 4 and FIG. 5, the points $P_1$ to $P_4$ are on the sides that are parallel to the Z"-axial direction in the reference rectangle 30. Thus, when the rod-shaped supporting portions 32 are disposed to extend in a direction perpendicular to the sides, only the bending stress by the displacement of vibration in the Z"-axial direction is applied to the supporting portions 32, and the absolute value of the displacement of vibration is comparatively small. Therefore, the supporting portions 32 can support the blank 31 without largely affecting the vibration characteristic of the blank 31.

Thus, in the crystal resonator of this embodiment, the supporting portions 32 are connected to the positions (in the example illustrated in FIG. 4 and FIG. 5, one or a plurality of points $P_1$ to $P_4$) where, near the apexes of the reference rectangle 30 in the outer periphery of the blank 31, the displacement in the X"-axial direction or Z"-axial direction becomes a local minimum. Accordingly, the blank 31 can be supported without affecting the vibration characteristic of the blank 31. Since the supporting portions 32 are connected to the points where the displacements of vibration are the local minimums, it is not required to cause a resonance frequency of the supporting portion 32 to coincide with the resonance frequency of the blank 31. Thus, the supporting portions 32 can have a simplified constitution. For example, the supporting portion 32 can be constituted of a simple rod-shaped member or a beam member connected to the outer periphery of the blank 31. Further, since this crystal resonator employs the blank 31 vibrating with width and length-longitudinally coupling mode of vibration, good frequency/temperature characteristics is obtained. Accordingly, a crystal controlled oscillator with high accuracy and high stability can be obtained by the coupling of this crystal resonator and an oscillator circuit.

Figure 6:
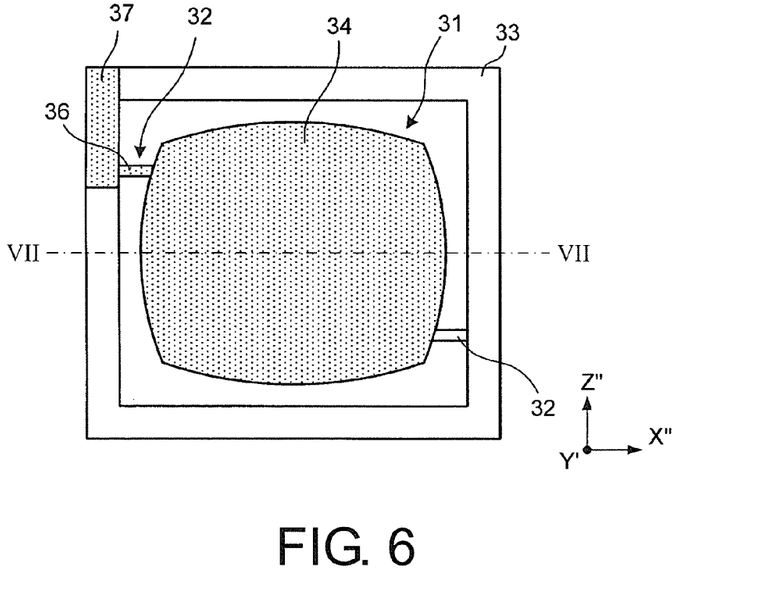
FIG. 6 is a plan view illustrating an exemplary specific constitution of the crystal resonator according to the one embodiment of the disclosure.
Figure 7:
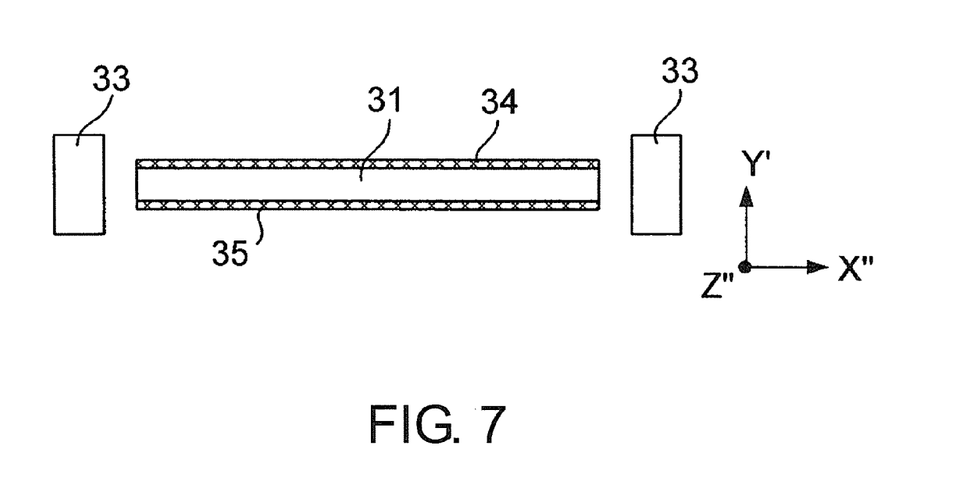
FIG. 7 is a cross-sectional view taken along the line VII-VII of FIG. 6.

FIG. 6 and FIG. 7 illustrate an exemplary specific constitution of the crystal resonator according to this embodiment constituted as described above.

This crystal resonator includes a frame 33 formed in an approximately rectangular shape, and the above-described blank 31 is held inside an opening of the frame 33. The example indicated here is assumed that the blank 31 illustrated in FIG. 3A is employed. In this case, the frame 33 is also formed so as to be parallel to the X"-axial direction and the Z"-axial direction. The blank 31 is supported by two rod-shaped supporting portions 32 extending from an inner wall of the frame 33. The two supporting portions 32 are mechanically connected to the blank 31 at respective two out of four above-described points $P_1$ to $P_4$ on the outer periphery of the elliptical blank 31. Here, the supporting portions 32 are connected to a pair of points $P_2$ and $P_4$ (see FIG. 4 and FIG. 5) that sandwich the center of the blank 31. The frame 33 has a thickness sufficiently thicker than the thickness of the blank 31. Thus, for example, when respective lid members are arranged on a top surface and a lower surface of the frame 33, and the blank 31 is stored in a space surrounded by the frame 33 and lid members, the blank 31 is prevented from being in contact with the lid members.

Such crystal resonator can be formed as follows: with preparation of a plate-shaped material of the crystal that corresponds to a Y-cut plate rotated by only an angle θ (however, +37°≤θ≤+51.5°) around the X-axis, a photolithography technology is applied to the plate-shaped material in order that the portions to be the blank 31, the supporting portion 32, and the frame 33 may be left, and the rest of the portions may be removed. When the crystal resonator is formed by the use of photolithography technology with respect to the plate-shaped material of the crystal, the supporting portion 32 and the frame 33 are also formed of the crystal and are integrally constituted with the blank 31.

Furthermore, an excitation electrode 34 is formed in approximately the entire surface of one of principal surfaces of the blank 31. Additionally, an extraction electrode 36 that ensures electrical connection to the excitation electrode 34 is formed on the surface of the one of the supporting portions 32 and extends to a connecting pad 37 formed on the top surface of the frame 33. Similarly, an excitation electrode 35 is formed also in approximately the entire surface of the other principal surface of the blank 31. The excitation electrode 35 is electrically connected to a connecting pad (not illustrated) formed on the lower surface of the frame 33 via an extraction electrode (not illustrated) formed on the surface of the other supporting portion 32.

As illustrated in FIG. 6 and FIG. 7, the blank 31 is supported at two points. However, as long as the blank 31 is supported at the position that is near the apex of the reference rectangle 30 (in other words, neither the position near the center line in the X"-axial direction of the reference rectangle 30 nor the position near the center line in the Z"-axial direction), and is the local minimum of the displacement of vibration in the X"-axial direction or Z"-axial direction in the width and length-longitudinally coupling mode of vibration, the number and position of the supporting points can be arbitrarily determined.

Figure 8A:
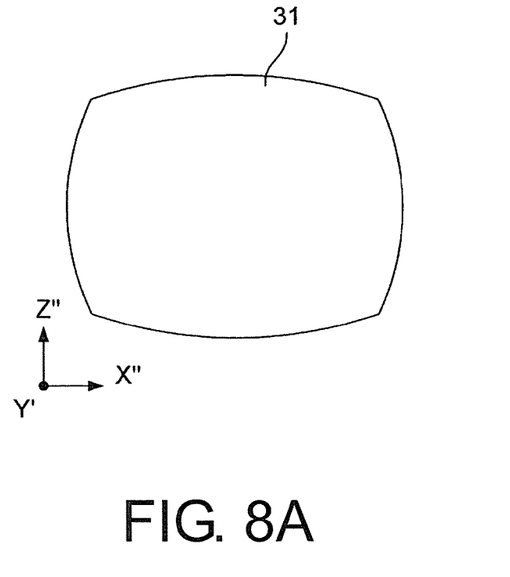
FIGS. 8A and 8B illustrate a switching of dimensions of the X"-axial direction and dimensions of Z"-axial direction by rotating the blank inside a surface of the blank.
Figure 8B:
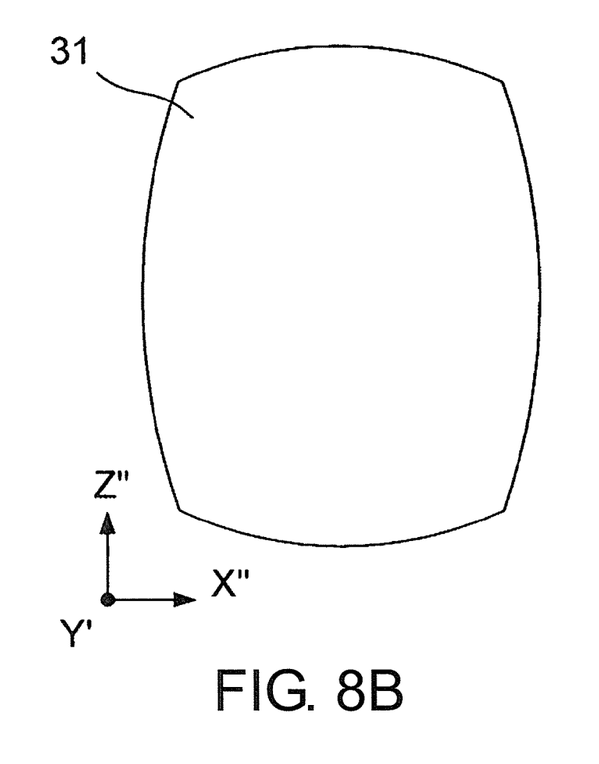

As described above, in the blank 31 of the crystal resonator according to this embodiment, the Y-cut plate is rotated around the X-axis, and is further rotated by 45° inside the surface. Thus, elastic coefficient $C'_{11}$ in the X"-axial direction and $C'_{33}$ in the Z"-axial direction are equal. Accordingly, as illustrated in FIG. 8A and FIG. 8B, rotating the blank 31 by 90° inside the surface ensures the completely same vibration characteristic even if the dimensions in the X"-axial direction and the dimensions in the Z"-axial direction are switched. FIG. 8A illustrates the blank 31 before the rotation of 90° inside the surface is performed. Here, the length in the X"-axial direction is longer than the length in the Z"-axial direction. In contrast to this, FIG. 8B illustrates the blank 31 after the rotation of 90° inside the surface is performed. Here, the length in the Z"-axial direction is longer than the length in the X"-axial direction.

In this embodiment, the blank 31 has the shape where each side of the reference rectangle 30 bulges outward. Therefore, it has been examined that a degree of a bulge would be to how much the extent to obtain good frequency/temperature characteristics. Here, the degree of the bulge is represented by how much ratio the bulge from the side of the reference rectangle 30 occupies with respect to the whole length. In view of the blank 31 illustrated in FIG. 3A, the opposite sides of the reference rectangle 30 each bulge. Thus, the degrees of the bulge δx in the X"-axial direction and δz in the Z"-axial direction are expressed respectively as follows:

$$\delta x = (a - Lx)/2a$$

$$\delta z = (b - Lz)/2b$$

With respect to various kinds of coupling of δx and δz, a variation of a primary temperature coefficient α at 25° C. in the frequency/temperature characteristics when the side ratio (b/a) was varied has been obtained by simulation. The results are illustrated in FIG. 9.

Additionally, the variation of the frequency/temperature characteristics has been examined when a cutting angle (the rotation angle θ) where the blank 31 was cut out from a quartz crystal was varied. With the setting of δx=4.4% and δz=2.6%, with respect to various rotation angles θ, a variation of a primary temperature coefficient α at 25° C. in the frequency/temperature characteristics when the side ratio (b/a) was varied has been obtained by simulation. The results are illustrated in FIG. 10. In FIG. 9 and FIG. 10, the portion surrounded by a circle indicates that the primary temperature coefficient α is approximately 0.

Figure 9:
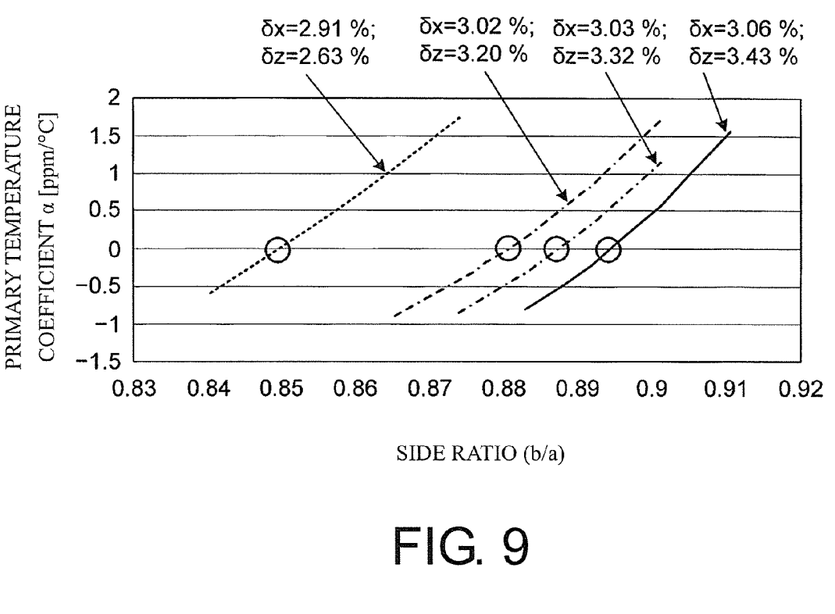
FIG. 9 is a graph illustrating a relation between a side ratio and a primary temperature coefficient in frequency/temperature characteristics corresponding to a degree of a bulge from reference rectangle.
Figure 10:
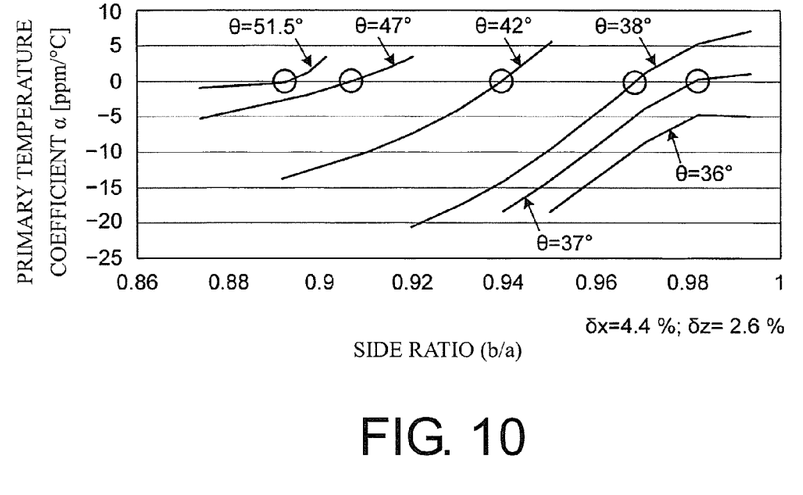
FIG. 10 is a graph illustrating a relation between the side ratio and the primary temperature coefficient in the frequency/temperature characteristics with respect to various rotation angles θ.

From FIG. 9 and FIG. 10, when the cutting angle, namely, the rotation angle θ is in a range of equal to or more than +37° and equal to or less than +51.5°, and the side ratio of the blank (b/a) is equal to or more than 0.84 and equal to or less than 0.98, it is seen that the frequency/temperature characteristics in that the primary temperature coefficient α becomes 0 near room temperature (25° C.) is obtained.

The crystal resonator of this disclosure uses the following blank as a vibration plate. Similar to a GT cut crystal resonator, a so-called Y-cut plate of the blank is rotated around an X-axis of a crystal. The Y-cut plate is further rotated by 45° inside the surface of the Y-cut plate. A difference of a crystal resonator of this disclosure from the GT cut crystal resonator is that a rotation angle θ, an angle of when the Y-cut plate of the crystal is rotated around the X-axis, is fixed in a range of +37°≤θ≤+51.5°. Setting θ=+51.5° forms an ordinary GT cut blank. When setting a rectangular GT cut blank θ=+51.5°, a primary temperature coefficient in frequency/temperature characteristics becomes zero near room temperature. However, this disclosure does not shape the blank into a simple rectangular as described later. This allows reducing the θ value smaller than +51.5° to obtain preferable characteristics. Reducing the θ value increases a piezoelectric constant. This allows easily obtaining good characteristics of the crystal resonator.

Further, this disclosure does not shape the blank into a rectangle having sides respectively parallel to the X"-axis and the Z"-axis (referred to as a reference rectangle). This disclosure swells at least a pair of opposed sides of this reference rectangle outward of this reference rectangle. Preferably, the blank has a shape swelling the respective four sides of the reference rectangle outward of the reference rectangle. The reference rectangle itself is imaginary, introduced for defining the shape of the blank. The actual blank does not make a remarkable difference in properties or a similar specification depending on whether the sides are swollen to the internal or external of the reference rectangle. The reference rectangle may be square. However, to prevent excitation of Lame vibration mode, the maximum dimensions of the blank in the X"-axial direction needs to differ from the maximum dimensions of the blank in the Z"-axial direction. Alternatively, the swollen shapes need to be different.

According to this disclosure, the blank can be obtained by rotating the Y-cut plate around the X-axis and then rotating the Y-cut plate by 45° inside the surface of the Y-cut plate. The blank is a rectangle having sides respectively parallel to the X"-axis and the Z"-axis (reference rectangle). Further, the blank has a shape swelling the respective sides of the reference rectangle outward. The use of this blank allows desirably designing a vibration characteristic and frequency/temperature characteristics. This increases a freedom of design of the crystal resonator. Compared with the GT cut blank having a simple elliptical shape, this case allows bringing a ratio of the maximum dimensions in the X"-axial direction and the maximum dimensions in the Z"-axial direction close to 1 while obtaining good frequency/temperature characteristics. This allows further downsizing the crystal resonator. This allows supporting the blank to the points where the displacement of vibration is a local minimum. This also allows configuring the crystal resonator that uses supporting portions with a compact, simple structure without affecting the vibration characteristic. Since the crystal resonator of this disclosure uses a longitudinal mode of vibration as a main vibration, the crystal resonator can be downsized also in a low frequency band.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal resonator, comprising:
a blank cut out from a crystal parallel to a surface that includes an X"-axis and a Z"-axis, the X"-axis and the Z"-axis being respectively obtained by rotating an X'-axis and a Z'-axis by 45° around a Y'-axis in a direction from the Z'-axis toward the X'-axis, the X'-axis, the Y'-axis, and the Z'-axis being respectively obtained by rotating a crystallographic X-axis, Y-axis, and Z-axis of the crystal by equal to or more than +37° and equal to or less than 51.5° around the X-axis; and
a supporting portion that supports the blank, wherein
the blank has a reference rectangle having sides respectively parallel to the X"-axis and the Z"-axis, the blank having a shape where at least one pair of opposite sides bulging outward of the reference rectangle, the blank having two longitudinal modes of vibration respectively perpendicular with the X"-axial direction and the Z"-axial direction, and
the supporting portion is connected to an outer periphery of the blank at a position near an apex of the reference rectangle, the position being where a displacement of vibration in the X"-axial direction or the Z"-axial direction becomes a local minimum when the two longitudinal modes of vibration are coupled.

2. The crystal resonator according to claim 1, wherein the supporting portion is made from the same crystal and is integrally formed with the blank.

3. The crystal resonator according to claim 1, wherein a maximum dimension of the blank in the X"-axial direction is defined as a and a maximum dimension of the blank in the Z"-axial direction is defined as b, the ratio b/a is equal to or more than 0.84 and equal to or less than 0.98.

4. The crystal resonator according to claim 1, further comprising
an excitation electrode formed on each principal surface of the blank.

5. The crystal resonator according to claim 1, wherein the blank has a shape where each of four sides of the reference rectangle bulges outward of the reference rectangle.

6. The crystal resonator according to claim 1, wherein the blank has a polygonal shape with corners where the number of the corners is equal to or more than six.

7. The crystal resonator according to claim 5, wherein
the blank has a shape where adjacent apexes of the
reference rectangle are each connected by an elliptical arc, and
two elliptical arcs are connected at an apex of the reference rectangle, wherein the elliptical arcs are cut out from different ellipses.

\* \* \* \* \*